(12) United States Patent
Kim et al.

(10) Patent No.: US 8,221,842 B2
(45) Date of Patent: Jul. 17, 2012

(54) METALLIC LAMINATE AND METHOD FOR PREPARING THE SAME

(75) Inventors: Byung-Nam Kim, Seoul (KR); Heon-Sik Song, Daejeon (KR); Joo-Eun Ko, Daejeon (KR); Soon-Yong Park, Daejeon (KR); Jung-Jin Shim, Pohang-si (KR)

(73) Assignee: LG Chem, Ltd., Seoul (KR)

( * ) Notice: Subject to any disclaimer, the term of this patent is extended or adjusted under 35 U.S.C. 154(b) by 765 days.

(21) Appl. No.: 12/224,803

(22) PCT Filed: Mar. 6, 2007

(86) PCT No.: PCT/KR2007/001101
§ 371 (c)(1),
(2), (4) Date: Sep. 5, 2008

(87) PCT Pub. No.: WO2007/102691
PCT Pub. Date: Sep. 13, 2007

(65) Prior Publication Data
US 2009/0101393 A1   Apr. 23, 2009

(30) Foreign Application Priority Data
Mar. 6, 2006  (KR) .................. 10-2006-0021120

(51) Int. Cl.
*H05K 1/00* (2006.01)

(52) U.S. Cl. ........ 427/343; 427/384; 427/97.1; 428/458

(58) Field of Classification Search .......... 427/97.1, 427/342.2, 384; 428/458
See application file for complete search history.

(56) References Cited

U.S. PATENT DOCUMENTS

| | | | |
|---|---|---|---|
| 4,937,133 A | 6/1990 | Watanabe et al. | |
| 5,176,811 A | 1/1993 | Keim et al. | |
| 5,300,364 A | 4/1994 | Hase et al. | |
| 6,346,298 B1 * | 2/2002 | Takahashi et al. | 427/409 |
| 6,436,467 B1 * | 8/2002 | Takahashi et al. | 427/97.6 |
| 2003/0006509 A1 | 1/2003 | Suzuki et al. | |
| 2005/0048297 A1 | 3/2005 | Fukuda et al. | |
| 2005/0100719 A1 * | 5/2005 | Kanakarajan et al. | 428/209 |

FOREIGN PATENT DOCUMENTS

| | | |
|---|---|---|
| CN | 1592540 A | 3/2005 |
| JP | 01-245586 | 9/1989 |
| JP | 04-318186 | 11/1992 |
| JP | 05-013902 | 1/1993 |
| JP | 08-250860 | 9/1996 |
| JP | 2006-021455 | 1/2006 |
| KR | 10-2003-0047764 | 6/2003 |

* cited by examiner

*Primary Examiner* — Michael Cleveland
*Assistant Examiner* — Tabassom Tadayyon Eslami
(74) *Attorney, Agent, or Firm* — McKenna Long & Aldridge LLP

(57) ABSTRACT

The present invention provides a metallic laminate and a method for preparing the same. The metallic laminate includes a metal layer, and at least one polyimide resin layer. The polyimide resin layer has a modulus of elasticity of 70 Mpa at 400° C.

8 Claims, 6 Drawing Sheets

[Fig. 1]
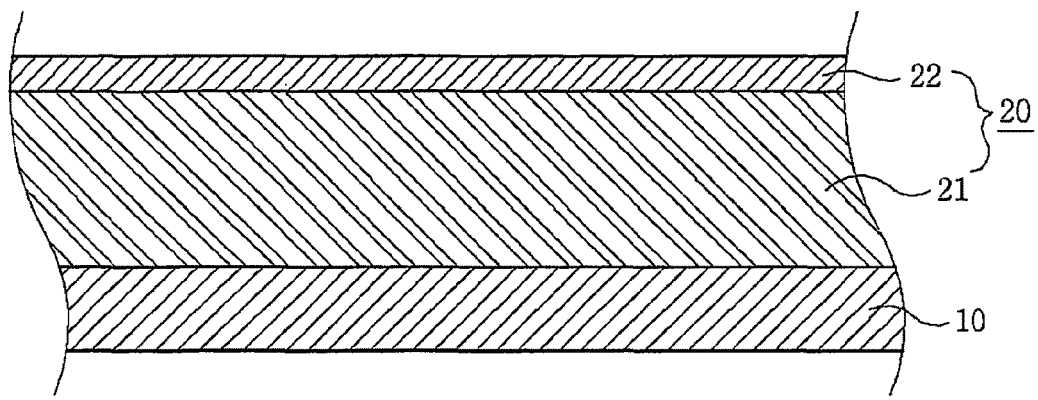
[Fig. 2]
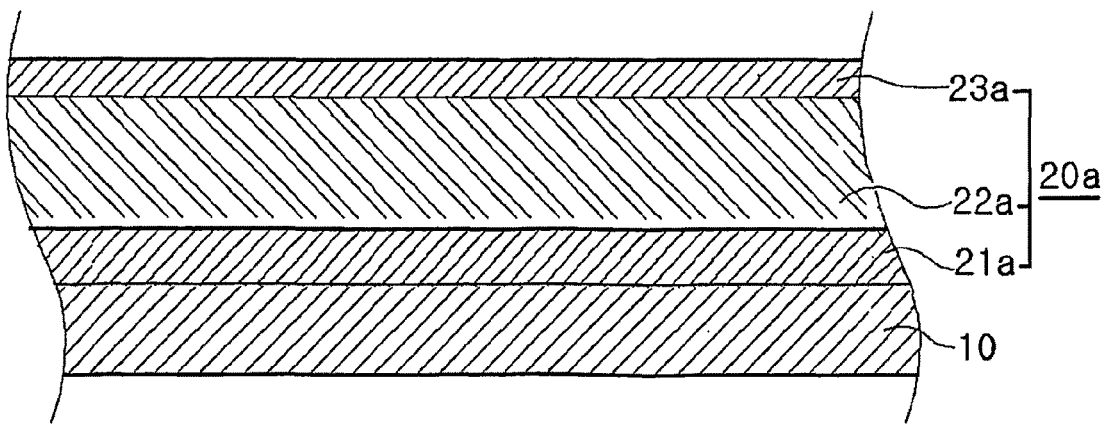

[Fig. 3]
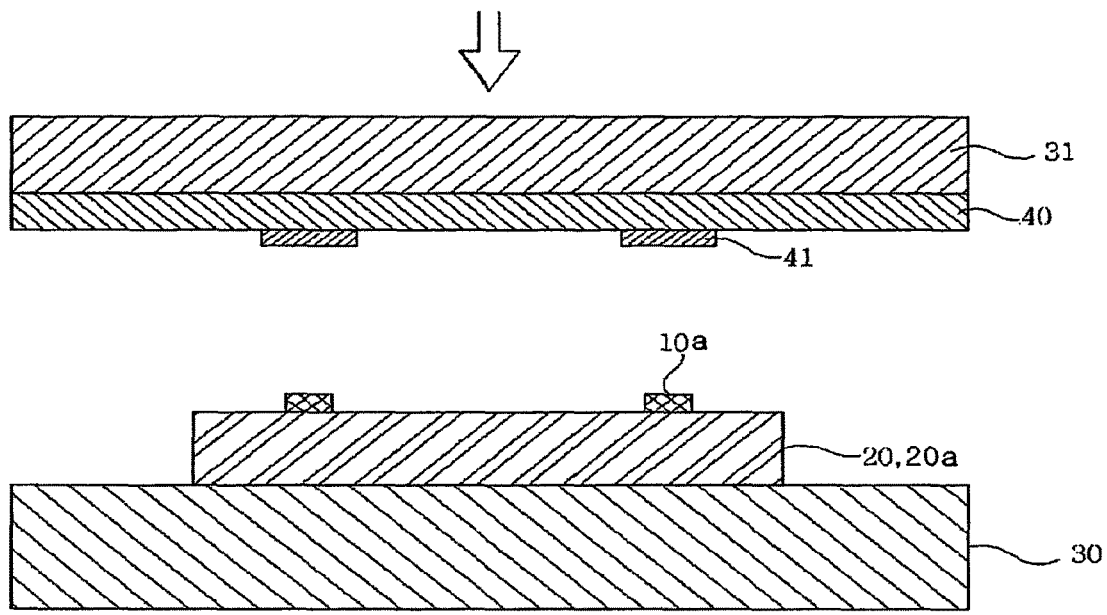
[Fig. 4]
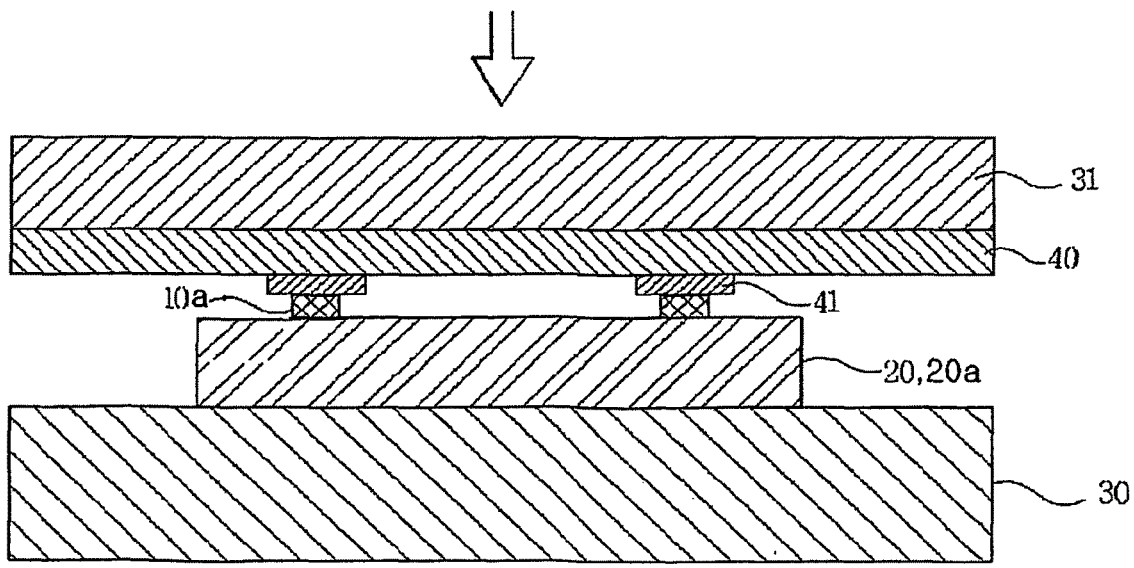

[Fig. 5]
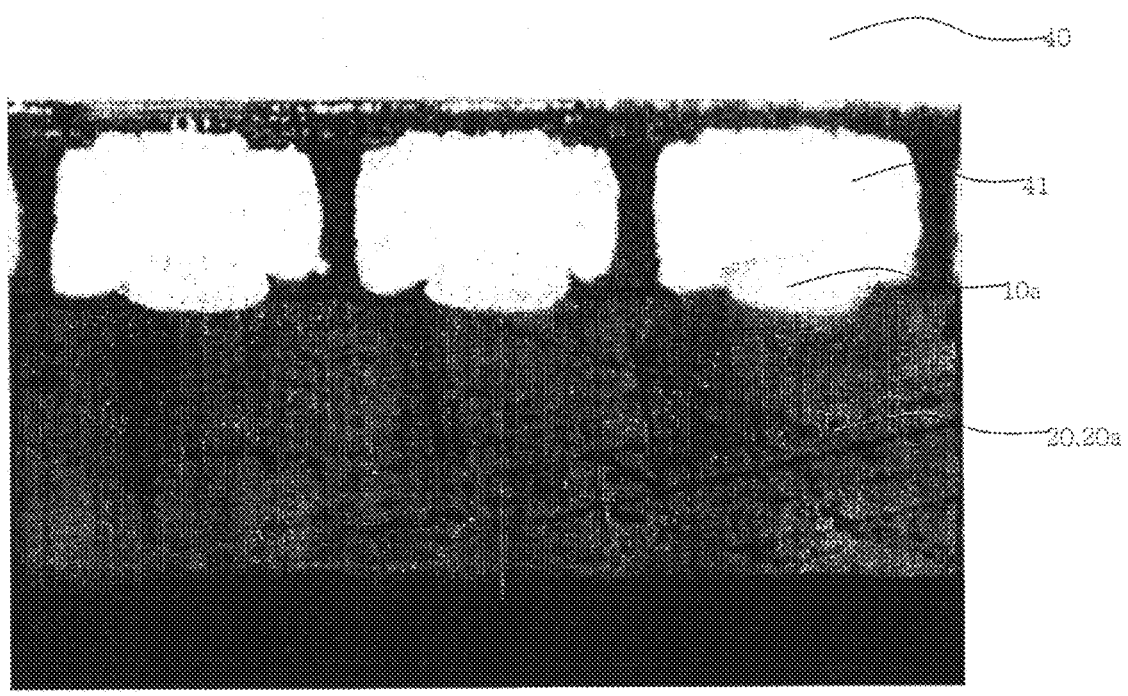

[Fig. 6]
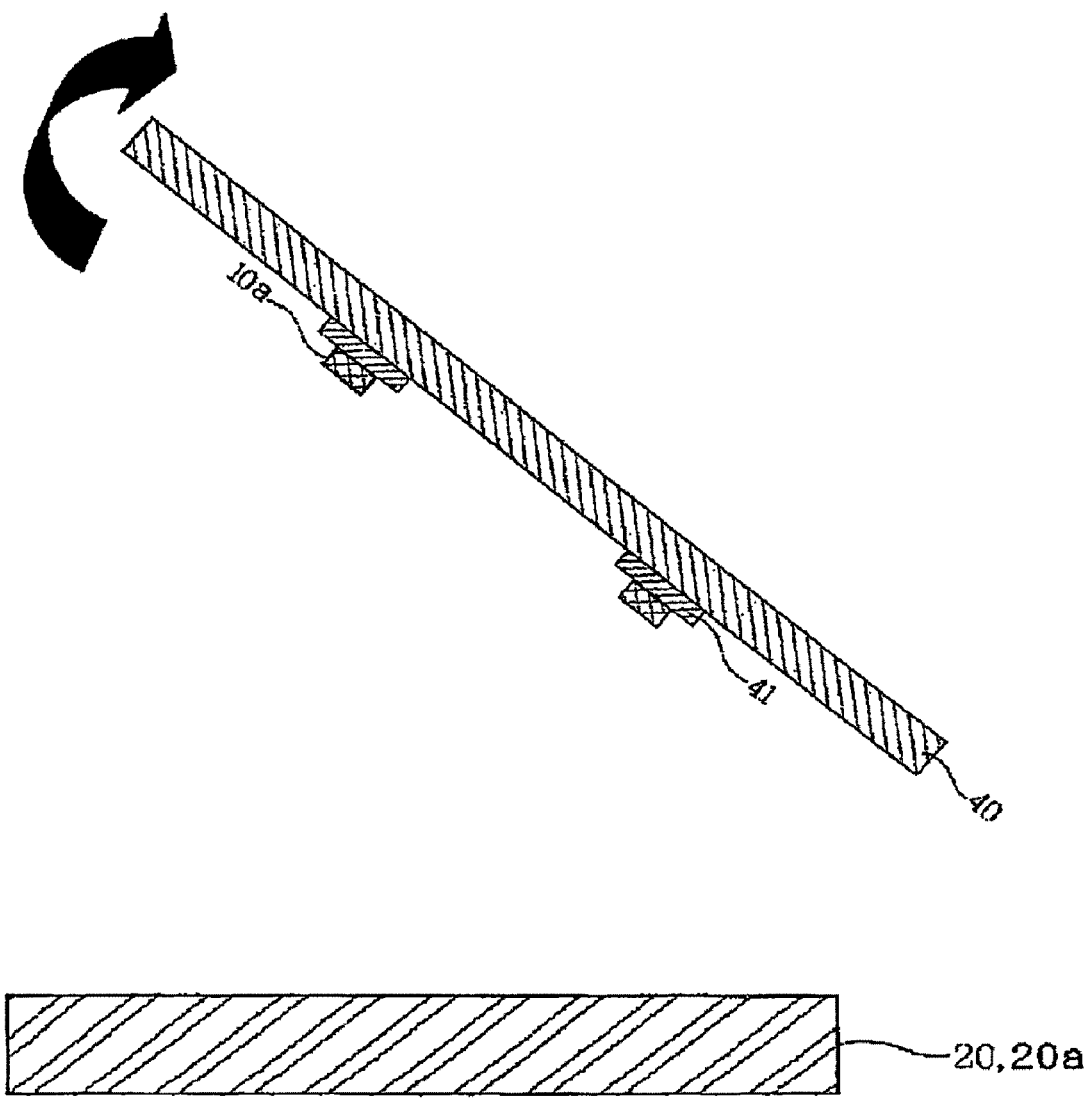

[Fig. 7]
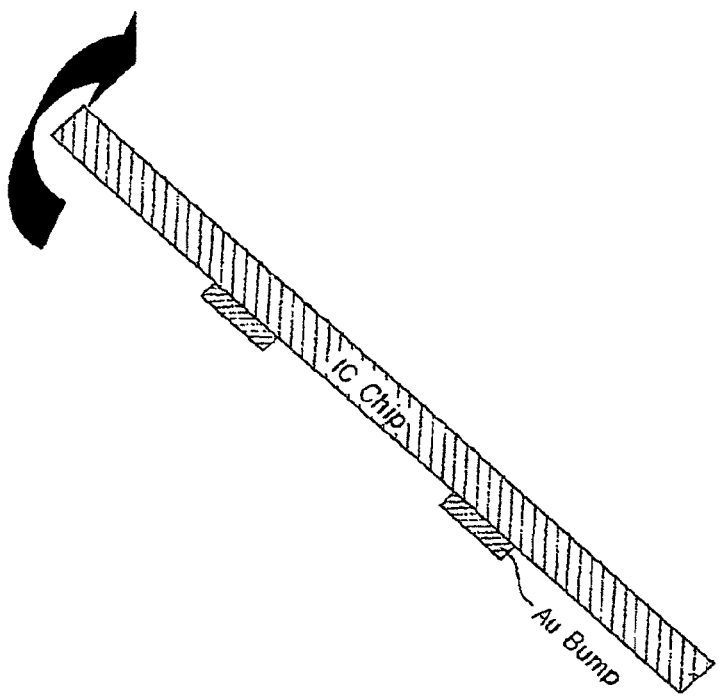
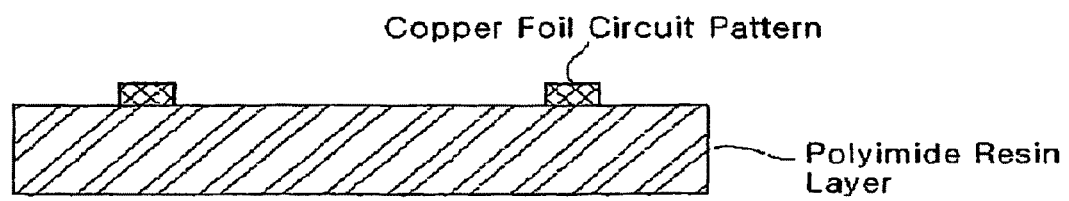

[Fig. 8]
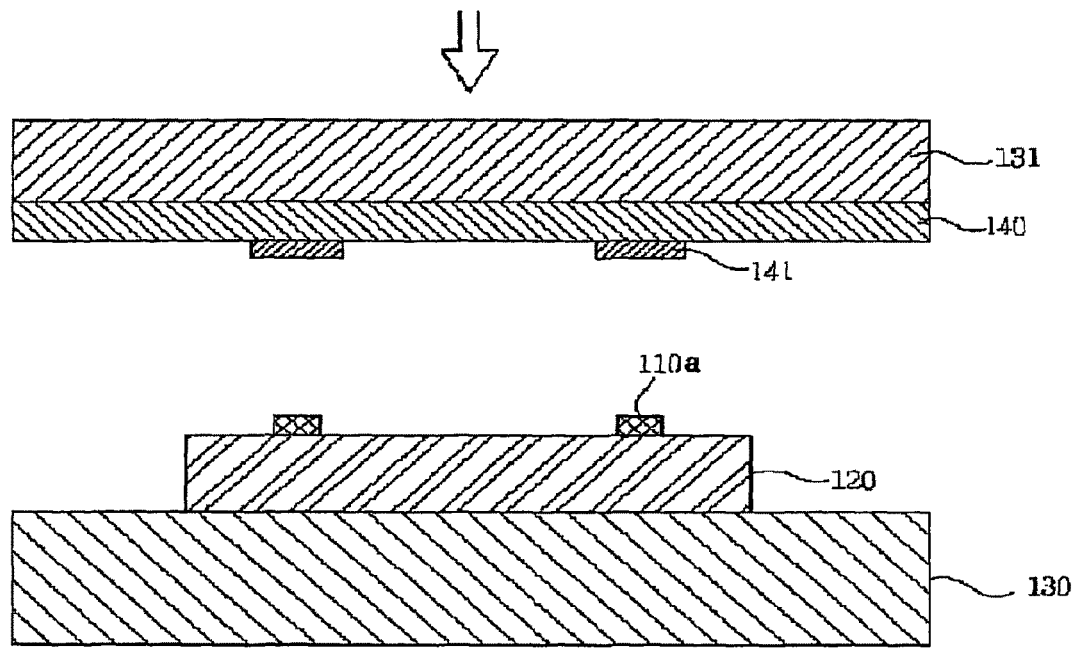
[Fig. 9]
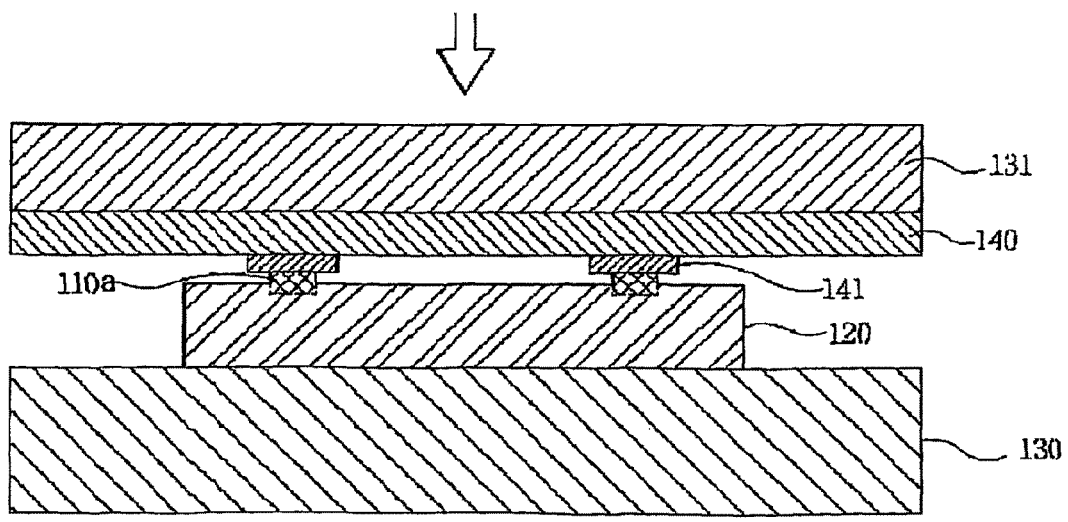

METALLIC LAMINATE AND METHOD FOR PREPARING THE SAME

This application is a 371 national stage entry of International Application No. PCT/KR2007/001101, filed on Mar. 6, 2007 that claims priority to Korean Patent Application No. 10-2006-0021120, filed on Mar. 6, 2006, both of which are hereby incorporated by reference in their entirety.

TECHNICAL FIELD

The present invention relates to a metallic laminate having a metal layer and a polyimide resin layer, and to a method for preparing the same.

This application claims priority from Korean Patent Application No. 10-2006-0021120 filed on Mar. 6, 2006 in the Korean Intellectual Property Office, the disclosure of which is incorporated herein by reference in its entirety.

BACKGROUND ART

According to the trends toward the complexity of an electronic apparatus, many wiring lines are substituted with a circuit board. It is known that the circuit board can reduce space, weight, and labor, and is more reliable than the wiring lines. In addition, with the reduction in thickness and lightweight of the electronic apparatus, existing hard printed circuit boards are chiefly substituted with flexible printed circuit boards.

A metallic laminate used for a flexible printed circuit board is roughly divided into a three-layered copper clad laminate (3CCL: 3-Copper-Clad-Laminate) and a two-layered copper clad laminate (2CCL: 2-Copper-Clad-Laminate).

The three-layered copper clad laminate is formed by compressing a copper foil and a polyimide film using an epoxy-based or acryl-based adhesive, and the two-layered copper clad laminate is composed of only polyimide and a copper foil without using an adhesive.

As a method of producing the two-layered copper clad laminate, there are known a sputtering method that deposits and laminates copper on a surface of a polyimide (PI) film and a casting method that coats a polyimide precursor solution on a copper foil, dries the polyimide precursor solution, and thermally or chemically imidizes (cures) the polyimide precursor solution, thereby forming a laminate.

As an example, Japanese Unexamined Patent Publication No. 8-250860 discloses a two-layered copper clad laminate type printed circuit board that is produced using the casting method to have a three-layered laminated polyimide insulating layer, thereby reducing occurrence of a curl.

Here, the three-layered laminated polyimide insulating layer is composed of a first polyimide resin layer that is formed by coating a polyimide precursor solution on a surface of a copper foil as a conductor and imidizing the polyimide precursor solution to have a coefficient of thermal expansion of $20 \times 10^{-6}$/K or more, a second polyimide resin layer that is formed on the first polyimide resin layer in the same manner to have a coefficient of thermal expansion of $20 \times 10^{-6}$/K or less, and a third polyimide resin layer that is formed on the second polyimide resin layer in the same manner to have a coefficient of thermal expansion of $20 \times 10^{-6}$/K or more. In this case, the first polyimide resin layer that is formed on a copper foil layer as an adhesive layer is formed to have a soft physical property, thereby improving adhesiveness to the copper foil.

As shown in FIG. 8, the polyimide resin layer 120 composed of the first to third polyimide resin layers and the copper foil layer formed on the polyimide resin layer 120 are etched to form a copper foil circuit pattern 110a in the copper clad laminate. Then, an IC chip 140 that has an Au bump 141 for signal processing of the IC chip 140 is bonded on the copper clad laminate using a stage 130 and a tool bonder 131.

When the copper foil circuit pattern 110a and the Au bump 141 of the IC chip 140 are bonded, a temperature of the tool bonder 131 is high, for example, at 350 to 450° C. Accordingly, as shown in FIG. 9, there is a problem in that the first polyimide resin layer of the polyimide resin layer 120 that is disposed below the copper foil circuit pattern 110a is softened, and the copper foil circuit pattern 110a is compressed toward the polyimide resin layer 120.

Further, the first polyimide resin layer has the coefficient of thermal expansion of $20 \times 10^{-6}$/K or more, which is different from the copper foil. Accordingly, there is a problem in that high-temperature adhesiveness between the copper foil and the first polyimide resin layer of the polyimide resin layer is degraded due to thermal expansion on the above-described high-temperature condition.

DISCLOSURE OF INVENTION

Technical Problem

Accordingly, it is an object of the present invention to provide a metallic laminate that can prevent high-temperature adhesiveness between a metal layer and a polyimide resin layer from being degraded at high temperature, prevent a circuit pattern from being compressed when a metallic laminate and an IC chip are bonded on a high-temperature condition, and realize ease of producing and reduction in production cost, and a method for preparing the same.

Technical Solution

An aspect of the present invention provides a metallic laminate including a metal layer and at least one polyimide resin layer. The polyimide resin layer has a modulus of elasticity of 70 Mpa or more at 400° C.

The metal layer can be formed of any one of copper, aluminum, iron, nickel, silver, palladium, chromium, molybdenum and tungsten, and an alloy thereof.

The polyimide resin layer can be formed from a polyimide precursor solution prepared by mixing at least one dianhydride selected from the group consisting of pyromellitic dianhydride (PMDA), 3,3',4,4'-biphenyltetracarboxylic dianhydride (BPDA), 3,3',4,4'-benzophenonetetracarboxilic dianhydride (BTDA), 4,4'-oxydiphthalic anhydride (ODPA), 4,4'-(4,4'-isopropyl biphenoxy)biphthalic anhydride (BPADA), 2,2'-bis(3,4-dicarboxyphenyl)hexafluoropropane dianhydride (6FDA), and ethylene glycol bis(anhydro-trimellitate) (TMEG) with at least one diamine selected from the group consisting of para-phenylene diamine (p-PDA), m-phenylene diamine (m-PDA), 4,4'-oxydianiline (4,4'-ODA), 3,4'-oxydianiline (3,4'-ODA), 2,2-bis(4-[4-aminophenoxy]-phenyl)propane (BAPP), 1,3-bis(4-aminophenoxy)benzene (TPE-R), 2,2-bis(4-[3-aminophenoxy]phenyl) sulfone (m-BAPS), 3,3'-dihydroxy-4,4'-diaminobiphenyl (HAB), and 4,4'-diaminobenzanilide (DABA).

The polyimide resin layer may include a first polyimide resin layer that is laminated on the metal layer, and a second polyimide resin layer that is laminated on the first polyimide resin layer.

When the polyimide resin layer includes the first and second polyimide resin layers, the first polyimide resin layer laminated on the metal layer serves as an adhesive layer that adheres the polyimide resin layer to the metal layer and as a base layer that shows a main physical property of the metallic laminate. Further, the second polyimide resin layer laminated on the first polyimide resin layer corrects a curl occurring in the polyimide resin layer after an etching process of the metal layer. The curl may occur in the metallic laminate itself or may occur in the polyimide resin layer after the metal layer of the metallic laminate is etched. In order to eliminate the curl occurring in the metallic laminate itself, the average coefficient of thermal expansion (CTE) of the polyimide resin layers should be consistent with the coefficient of thermal expansion (CTE) of the metal layer. Further, in order to eliminate the curl occurring in the polyimide resin layer after the metal layer is etched, a force balance is needed among the polyimide resin layers after the metal layer is etched. In case of the metallic laminate, if the curl is not eliminated, it is difficult to perform chip bonding or outer lead bonding (OLB), such as ACF (Anisotropic Conductive Film) bonding.

The first polyimide resin layer may have a thickness of 80% or more of the total thickness of the polyimide resin layer including the first and second polyimide resin layers.

For example, the thickness of the first polyimide resin layer may be 30□ to 40□, and preferably, 32□ to 38 □.

The entire polyimide resin layer including the first and second polyimide resin layers may have a coefficient of thermal expansion of 20 ppm/K or less.

When the coefficient of thermal expansion of the entire polyimide resin layer including the first and second polyimide resin layers may be 20 ppm/K or less, the entire polyimide resin layer may have a modulus of elasticity of 70 Mpa or more at high temperature, for example, at 400° C. If the modulus of elasticity is 70 Mpa or more at high temperature of 400° C., the modulus of elasticity may also be 70 Mpa or more at high temperature of more than 400° C. Here, the modulus of elasticity represents a degree of expansion by force, and the coefficient of thermal expansion (CTE) represents a degree of thermal expansion. A linear relationship having a negative slope is established between the modulus of elasticity and the coefficient of thermal expansion.

In the polyimide resin layer including the first and second polyimide resin layers, the coefficient of thermal expansion of the first polyimide resin layer may be 20 ppm/K or less and/or the coefficient of thermal expansion of the second polyimide resin layer may exceed 20 ppm/K.

When the polyimide resin layer includes the first polyimide resin layer that is laminated on the metal layer and has a coefficient of thermal expansion of 20 ppm/K or less and the second polyimide resin layer that is laminated on the first polyimide resin layer and has a coefficient of thermal expansion of more than 20 ppm/K, the coefficient of thermal expansion of the entire polyimide resin layer including the first and second polyimide resin layers may be 20 ppm/K or less.

The polyimide resin layer may include a first polyimide resin layer that is laminated on the metal layer and has a coefficient of thermal expansion of 20 ppm/K or less, a second polyimide resin layer that is laminated on the first polyimide resin layer and has a coefficient of thermal expansion of 20 ppm/K or less, and a third polyimide resin layer that is laminated on the second polyimide resin layer and has a coefficient of thermal expansion of 20 ppm/K or more.

In this case, the coefficient of thermal expansion of the entire polyimide resin layer including the first to third polyimide resin layers may be 20 ppm/K or less.

When the polyimide resin layer includes the first to third polyimide resin layers, the first polyimide resin layer laminated on the metal layer serves as an adhesive layer that adheres the polyimide resin layer to the metal layer, and the second polyimide resin layer laminated on the first polyimide resin layer serves as a base layer that shows a main physical property of the metallic laminate. In addition, the third polyimide resin layer laminated on the second polyimide resin layer corrects a curl occurring after an etching process of the metal layer.

Another aspect of the present invention provides a flexible printed circuit board that is formed by bonding an IC (Integrated Circuit) chip to the above-described metallic laminate.

Still another aspect of the present invention provides a method for preparing a flexible printed circuit board including the steps of a) etching the metal layer of the above-described metallic laminate so as to form a circuit pattern, b) plating the circuit pattern of the metallic laminate, c) placing the metallic laminate having the plated circuit pattern on a stage, d) mounting an IC (Integrated Circuit) chip having a bump on a tool bonder, e) moving the tool bonder, on which the IC chip is mounted, so as to locate the IC chip above the metallic laminate such that the bump of the IC chip faces the circuit pattern of the metallic laminate, and f) compressing the tool bonder, on which the IC chip is mounted, against the metallic laminate disposed on the stage so as to bond the bump of the IC chip and the circuit pattern of the metallic laminate to each other.

In the a) step, the metal layer of the metallic laminate is etched and patterned so as to form the circuit pattern. The pitch of the circuit pattern (an interval between lines of the circuit pattern) may be 25 to 38 □.

In the b) step, the circuit pattern of the metallic laminate may be plated with at least one metal selected from a group of Sn and Au. In the b) step, when the circuit pattern of the metallic laminate is plated with at least one metal selected from a group of Sn and Au, its thickness may be 0.2 to 0.3 □.

In the c) step, the temperature of the stage may be 30 to 200° C. Here, the reason why the temperate of the stage is in a wide range of 30 to 200° C. is to align the bump of the IC chip and the circuit pattern of the metallic laminate with each other. That is, it is to align the bump of the IC chip and the circuit pattern of the metallic laminate with each other by adjusting a thermal expansion rate in a transverse direction, in which the circuit pattern of the metallic laminate is arranged.

In the d) step, the bump of the IC chip may be an gold (Au) bump that is plated with gold.

In the d) step, the temperature of the tool bonder may be 350 to 450° C.

In the f) step, a compressive force when the tool bonder, on which the IC chip is mounted, is compressed toward the metallic laminate disposed on the stage may be in a range of 6 to 14 kgf.

In the f) step, the tool bonder, on which the IC chip is mounted, may be compressed toward the metallic laminate disposed on the stage for 0.2 to 1 second.

After the IC chip bonding process, with an IL (inner lead) peel-off test, it can be confirmed that the bump of the IC chip and the circuit pattern of the metallic laminate are favorably bonded to each other. FIG. 6 is a diagram showing a test result that the bump of the IC chip and the circuit pattern of the metallic laminate are favorably bonded to each other. FIG. 7 is a diagram showing defective bonding between the bump of the IC chip and the circuit pattern of the metallic laminate.

Yet still another aspect of the present invention provides a method for preparing a metallic laminate including a step of coating a polyimide precursor solution on a metal layer and drying and curing the polyimide precursor solution so as to form a polyimide resin layer having a modulus of elasticity of 70 Mpa or more at 400° C. All the contents of the above-described metallic laminate can be applied to the method for preparing a metallic laminate.

The step of forming the polyimide resin layer may include the steps of coating a first polyimide precursor solution on the metal layer and drying and curing the first polyimide precursor solution so as to form a first polyimide resin layer, and coating a second polyimide precursor solution on the first polyimide resin layer and drying and curing the second polyimide precursor solution so as to form a second polyimide resin layer. The entire polyimide resin layer including the first and second polyimide resin layers may have a coefficient of thermal expansion of 20 ppm/K or less.

The step of forming the polyimide resin layer may include the steps of coating a first polyimide precursor solution on the metal layer and drying the first polyimide precursor solution so as to form a first drying resin layer; coating a second polyimide precursor solution on the first drying resin layer and drying the second polyimide precursor solution so as to form a second drying resin layer; and curing the first and second drying resin layers so as to form a first and second polyimide resin layers. The entire polyimide resin layer including the first and second polyimide resin layers may have a coefficient of thermal expansion of 20 ppm/K or less.

In the polyimide resin layer including the first and second polyimide resin layers, the first polyimide resin layer may be formed by coating a first polyimide precursor solution on the metal layer and drying and curing the first polyimide precursor solution so as to have a coefficient of thermal expansion of 20 ppm/K or less, and the second polyimide resin layer may be formed by coating a second polyimide precursor solution on the first polyimide resin layer and drying and curing the second polyimide precursor solution. At this time, the second polyimide resin layer may be formed to have a co-efficient of thermal expansion of more than 20 ppm/K.

The step of forming the polyimide resin layer may include the steps of coating a first polyimide precursor solution on the metal layer and drying the first polyimide precursor solution so as to form a first drying resin layer; coating a second polyimide precursor solution on the first drying resin layer and drying the second polyimide precursor solution so as to form a second drying resin layer; and curing the first and second drying resin layers so as to form a first polyimide resin layer having a co-efficient of thermal expansion of 20 ppm/K or less and a second polyimide resin layer. At this time, the second polyimide resin layer may be formed to have a coefficient of thermal expansion of more than 20 ppm/K.

When the polyimide resin layer includes the first polyimide resin layer that is formed by coating a first polyimide precursor solution on the metal layer and drying and curing the first polyimide precursor solution so as to have a coefficient of thermal expansion of 20 ppm/K or less, and the second polyimide resin layer that is formed by coating a second polyimide precursor solution on the first polyimide resin layer and drying and curing the second polyimide precursor solution so as to have a coefficient of thermal expansion of more than 20 ppm/K, the entire polyimide resin layer including the first and second polyimide resin layers may have a coefficient of thermal expansion of 20 ppm/K or less.

The step of forming the polyimide resin layer may include the steps of
coating a first polyimide precursor solution on the metal layer and drying the first polyimide precursor solution so as to form a first drying resin layer; coating a second polyimide precursor solution on the first drying resin layer and drying the second polyimide precursor solution so as to form a second drying resin layer; and curing the first and second drying resin layers so as to form a first polyimide resin layer having a coefficient of thermal expansion of 20 ppm/K or less and a second polyimide resin layer having a coefficient of thermal expansion of more than 20 ppm/K. The entire polyimide resin layer including the first and second polyimide resin layers may have a coefficient of thermal expansion of 20 ppm/K or less.

The step of forming the polyimide resin layer may include the steps of coating a first polyimide precursor solution on the metal layer and drying and curing the first polyimide precursor solution so as to form a first polyimide resin layer having a co-efficient of thermal expansion of 20 ppm/K or less, coating a second polyimide precursor solution on the first polyimide resin layer and drying and curing the second polyimide precursor solution so as to form a second polyimide resin layer having a co-efficient of thermal expansion of 20 ppm/K or less, and coating a third polyimide precursor solution on the second polyimide resin layer and drying and curing the third polyimide precursor solution so as to form a third polyimide resin layer having a co-efficient of thermal expansion of 20 ppm/K or more. The polyimide resin layer include the first to third polyimide resin layers.

Herein, the entire polyimide resin layer including the first to third polyimide resin layers may have a coefficient of thermal expansion of 20 ppm/K or less.

The step of forming the polyimide resin layer may include the steps of coating a first polyimide precursor solution on the metal layer and drying the first polyimide precursor solution so as to form a first drying resin layer; coating a second polyimide precursor solution on the first drying resin layer and drying the second polyimide precursor solution so as to form a second drying resin layer; coating a third polyimide precursor solution on the second drying resin layer and drying the third polyimide precursor solution so as to form a third drying resin layer; and curing the first to third drying resin layers so as to form a first polyimide resin layer having a coefficient of thermal expansion of 20 ppm/K or less, a second polyimide resin layer having a co-efficient of thermal expansion of 20 ppm/K or less, and a third polyimide resin layer having a coefficient of thermal expansion of 20 ppm/K or more. The polyimide resin layer include the first to third polyimide resin layers.

Herein, the entire polyimide resin layer including the first to third polyimide resin layers may have a coefficient of thermal expansion of 20 ppm/K or less.

Advantageous Effects

As described above, according to the aspects of the present invention, since the modulus of elasticity is 70 Mpa or more at high temperature of 400° C., a circuit pattern can be prevented from being collapsed when the metallic laminate and the IC chip are bonded to each other on a high-temperature condition.

Further, according to the aspects of the present invention, the polyimide resin layer having a coefficient of thermal expansion of 20 ppm/K or less is laminated on the metal layer, thereby improving high-temperature adhesiveness between the metal layer and the polyimide resin layer.

In addition, according to the aspects of the present invention, the two-layered polyimide resin layer is formed, and thus the structure can be simplified, compared with a three-layered polyimide resin layer. Therefore, ease of production can be realized, productivity can be improved, and production costs can be reduced.

BRIEF DESCRIPTION OF THE DRAWINGS

FIG. 1 is a cross-sectional view of a copper clad laminate including a copper foil layer and first and second polyimide resin layers according to an embodiment of the present invention.

FIG. 2 is a cross-sectional view of a copper clad laminate including a copper foil layer and first to third polyimide resin layers according to another embodiment of the present invention.

FIGS. 3 and 4 are process views showing a bonding process of a copper clad laminate and an IC chip according to an embodiment of the present invention.

FIG. 5 is a photograph showing a section when the metallic laminate and the IC chip are bonded to each other according to an embodiment of the present invention.

FIGS. 6 and 7 are diagrams showing the result of an IL (Inner Lead) peel-off test after the bonding process of the copper clad laminate and the IC chip. (FIG. 6—pass/FIG. 7—Disqualification)

FIGS. 8 and 9 are process views showing a bonding process of a copper clad laminate and an IC chip according to the related art.

| Reference Numerals | |
|---|---|
| 10: | Copper Foil Layer |
| 10a: | Copper Foil Circuit Pattern |
| 20: | Polyimide Resin Layer |
| 21: | First Polyimide Resin Layer |
| 22: | Second Polyimide Resin Layer |
| 30: | Stage |
| 31: | Tool Bonder |
| 40: | IC (Integrated Circuit) Chip |
| 41: | Au Bump |

MODE FOR THE INVENTION

Embodiments of the present invention will now be described in detail with reference to the accompanying drawings.

As a metallic laminate according to the aspects of the present invention, as shown in FIG. 1, a copper clad laminate includes a copper foil layer 10 as a metal layer, and a polyimide resin layer 20 laminated on the copper foil layer 10.

Although the copper foil layer 10 formed of copper (Cu) is described as a metal layer, the present invention is not limited thereto. For example, the metal layer may be formed of various metals, such as copper, aluminum, iron, nickel, silver, palladium, chromium, molybdenum, tungsten, and an alloy thereof.

The polyimide resin layer 20 includes a first polyimide resin layer 21 laminated on the copper foil layer 10 and a second polyimide resin layer 22 laminated on the first polyimide resin layer 21. The polyimide resin layer 20 including the first and second polyimide resin layers 21 and 22 has a modulus of elasticity of 70 Mpa or more at high temperature of 400° C. Although a case where the temperature condition is 400° C. is described, the modulus of elasticity is also 70 Mpa or more at high temperature of more than 400° C. Meanwhile, in FIG. 1, the polyimide resin layer 20 includes the first and second polyimide resin layers 21 and 22, but a polyimide resin layer 20a may include first to third polyimide resin layers 21a, 22a, and 23a.

Here, the first and second polyimide resin layers 21 and 22 are formed of resin having an imide bond, such as polyimide, polyamideimide, or polyetherimide.

The first polyimide resin layer has high thermal resistance. The coefficient of thermal expansion of the first polyimide resin layer is 20 ppm/K or less.

The first polyimide resin layer 21 is preferably formed to have a thickness of 80% or more with respect to the total thickness of the polyimide resin layer 20 in longitudinal section. If the first polyimide resin layer 21 is formed to have a thickness of less than 80%, a curl may occur in the polyimide resin layer 20 after the copper foil layer 10 is etched. In order to prevent the curl from occurring in the polyimide resin layers 21 and 22 after the copper foil layer 10 is etched, the coefficients of thermal expansion and the moduli of elasticity of the polyimide resin layers 21 and 22 need to be taken into account. This is because, after the copper foil of the copper foil layer 10 is removed by etching, if a force is not balanced between the polyimide resin layers 21 and 22 due to a difference in the coefficient of thermal expansion between the polyimide resin layers 21 and 22 and a difference in the modulus of elasticity according to the thickness, the curl may occur.

Accordingly, the thickness of the first polyimide resin layer 21 is 30☐ to 40☐, and preferably, 32☐ to 38 ☐.

The second polyimide resin layer 22 has a coefficient of thermal expansion of more than 20 ppm/K, that is, a high thermal expansion property. The second polyimide resin layer 22 is formed above the first polyimide resin layer 21 and corrects a curl occurring in the polyimide resin layer 20 after an etching process of the copper foil layer 10. The first polyimide resin layer 21 has a coefficient of thermal expansion of 20 ppm/K or less and thus it has a property similar to the coefficient of thermal expansion (CTE) of the copper foil layer 10. However, when the thicknesses and the moduli of elasticity of the copper foil layer 10 and the entire polyimide resin layer 20 are taken into account, the modulus of elasticity of the copper foil layer 10 is ten times than the modulus of elasticity of the entire polyimide resin layer 20. Accordingly, in order to prevent the curl from occurring, a force needs to be balanced between the copper foil layer 10 and the polyimide resin layer 20 after the polyimide resin layer 20 is laminated on the copper foil layer 10. Therefore, a ratio between the thickness of the copper foil layer 10 and the thickness of the polyimide resin layer 20 needs to correspond to a difference in the modulus of elasticity. When the ratio of the thicknesses does not correspond to the difference in the modulus of elasticity, the curl of the polyimide resin layer 20 toward the copper foil layer 10 can be controlled by adjusting the coefficient of thermal expansion and the thickness of the second polyimide resin layer 22.

Hereinafter, a method for producing the copper clad laminate having the above-described structure will be described.

The method for producing the copper clad laminate includes a step of coating a polyimide precursor solution for forming the first polyimide resin layer 21 on the copper foil layer 10 and drying the polyimide precursor solution, a step of coating a polyimide precursor solution for forming the second polyimide resin layer 22 and drying the polyimide precursor solution, and a step of increasing a temperature to a curing temperature so as to cure the coated polyimide precursor solutions.

The polyimide precursor solutions used in the coating steps can be produced in a varnish shape in which dianhydride and diamine are mixed in an organic solvent. Further, in the coating steps, a die coater, a comma coater, a reverse comma coater, and a gravure coater may be used. Of course, other technologies used for coating can be used.

According to the embodiment of the present invention, when the polyimide precursor solution is produced, polyimide resin having a desired coefficient of thermal expansion can be obtained by adjusting a mixture ratio between dianhydride and diamine or a mixture between dianhydrides or diamines, or by adjusting kinds of dianhydrides and diamines to be selected.

As the dianhydride, at least one compound selected from the group consisting of pyromellitic dianhydride (PMDA), 3,3',4,4'-biphenyltetracarboxylic dianhydride (BPDA), 3,3', 4,4'-benzophenonetetracarboxilic dianhydride (BTDA), 4,4'-oxydiphthalic anhydride (ODPA), 4,4'-(4,4'-isopropyl biphenoxy)biphthalic anhydride (BPADA), 2,2'-bis(3,4-dicarboxyphenyl)hexafluoropropane dianhydride (6FDA), and ethylene glycol bis(anhydro-trimellitate) (TMEG) can be used.

As the diamine, at least one compound selected from the group consisting of paraphenylene diamine (p-PDA), m-phenylene diamine (m-PDA), 4,4'-oxydianiline (4,4'-ODA), 3,4'-oxydianiline (3,4'-ODA), 2,2-bis(4-[4-aminophenoxy]-phenyl)propane (BAPP), 1,3-bis(4-aminophenoxy)benzene (TPE-R), 2,2-bis(4-[3-aminophenoxy]phenyl)sulfone (m-BAPS), 3,3'-dihydroxy-4,4-diaminobiphenyl (HAB), and 4,4'-diaminobenzanilide (DABA) can be used.

Of course, a small amount of other diamines or dianhydrides, or other compounds than the above compounds can be added.

The organic solvent selected from the group consisting of N-methyl-2-pyrrolidone (NMP), N,N-dimethyl acetamide (DMAc), tetrahydrofuran (THF), N,N-dimethylformamide (DMF), dimethyl sulfoxide (DMSO), cyclohexane, acetonitrile, and a mixture thereof can be used, but not limited thereto.

Additives such as an antifoaming agent, an antigelling agent, and a curing accelerator can be further added, in order to facilitate coating or curing, or to improve other physical properties.

During the drying step, drying is carried out in an arch type oven or a floating type oven at a temperature of around 100 to 350° C., more preferably around 140 to 250° C., and during the curing step, curing is carried out at a temperature raised up to 350° C., leading to hardening, upon which curing (imidization) of the polyimide precursor solution proceeds.

Hereinafter, Examples 1 to 6 are provided for the purpose of specifically illustrating the method for producing a copper clad laminate. However, it should not be construed that the present invention will not be limited thereto.

Synthetic Example 1

Synthesis of Polyimide Precursor Solution For Forming Second Polyimide Resin Layer 2.65 g of p-PDA and 3.95 g of 4,4'-ODA were dissolved in 162□ of N-methylpyrrolidinon. To the solution, 13.32 g of BPDA was added, and stirred for 24 hours for polymerization. At this time, the polymerization temperature was set at 5° C. The temperature of the polymerized solution was raised to 350° C. to prepare a 40□ thick film.

While raising the temperature of the film at a rate of 10° C./min, the coefficient of thermal expansion of the film was measured by using TMA. As a result, the average coefficient of thermal expansion at a temperature in the range of 100° C. to 200° C. was 28 ppm/K.

Synthetic Examples 2 to 6

Synthesis of Polyimide Precursor Solution For Forming First Polyimide Resin Layer A polyimide precursor solution for forming a first polyimide resin layer was prepared in the same manner as in Synthetic Example 1 using dianhydrides and diamines as shown in the following Table 1.

TABLE 1

| | Dianhydride (g) | | | Diamine (g) | | Coefficient of Thermal Expansion × $10^{-6}$ (1/K) |
|---|---|---|---|---|---|---|
| Syn. Ex. 2 | BPDA 14.54 | PMDA | BTDA | p-PDA 5.38 | ODA | 13 |
| Syn. Ex. 3 | BPDA 13.90 | PMDA | BTDA | p-PDA 4.11 | ODA 1.90 | 19 |
| Syn. Ex. 4 | BPDA 12.58 | PMDA 0.52 | BTDA 0.77 | p-PDA 4.14 | ODA 1.91 | 18 |
| Syn. Ex. 5 | BPDA 2.83 | PMDA 2.10 | BTDA 9.30 | p-PDA 4.71 | 4,4'-ODA 0.97 | 20 |
| Syn. Ex. 6 | BPDA 11.83 | PMDA | BTDA | p-PDA | 4,4'-ODA 8.10 | 42 |

Example 1

The copper clad (10) having a thickness of 15□ (NA-VLP, available from Mitsui Metal Industries, Co., Ltd) was coated with the polyimide precursor solution prepared in Synthetic Example 2, and then cured to have the thicknesses of the polyimide resin layer after curing as shown in the following Tables 2 and 3. Thereafter, the resultant was dried at 140° C., and the copper clad was coated with the polyimide precursor solution prepared in Synthetic Example 1 in the same manner for contacting the clad with the solution, dried and then cured by raising the temperature up to 350° C. Then, the coefficient of thermal expansion of the entire polyimide resin layer (20) was measured (see Table 6). For measurement of the high-temperature adhesiveness, the layer was subject to a heat treatment at 150° C. for 168 hours, and then the adhesiveness between the copper clad (10) and the polyimide resin layer (20) was measured using a Universal tensile tester at room temperature (see Table 2). Further, the temperature was raised at a rate of 5° C./min using a Dynamic Mechanical Analyzer, and the modulus of elasticity of the entire polyimide resin layer (20) at 400° C. was measured (see Table 3).

Examples 2 to 4

Copper clad laminates were prepared in the same manner as in Example 1 using the polyimide precursor solutions as shown in the following Tables 2 and 3, and then the coefficient of thermal expansion of the entire polyimide resin layer (20) was measured (see Table 6). Further, the high-temperature adhesiveness between the copper clad (10) and the polyimide resin layer (20), and the modulus of elasticity of the polyimide resin layer (20) was measured (see Tables 2 and 3).

TABLE 2

| | First Layer | | Second Layer | | High-temperature |
|---|---|---|---|---|---|
| | Solution | Thickness (μm) | Solution | Thickness (μm) | Adhesiveness (g/cm) |
| Ex. 1 | Syn. Ex. 2 | 36 | Syn. Ex. 1 | 4 | 1200 |
| Ex. 2 | Syn. Ex. 3 | 32 | Syn. Ex. 1 | 8 | 1170 |
| Ex. 3 | Syn. Ex. 4 | 32 | Syn. Ex. 1 | 8 | 1210 |
| Ex. 4 | Syn. Ex. 5 | 32 | Syn. Ex. 1 | 8 | 1050 |

TABLE 3

| | First Layer | | Second Layer | | Modulus of Elasticity (400° C.) |
|---|---|---|---|---|---|
| | Solution | Thickness (μm) | Solution | Thickness (μm) | |
| Ex. 1 | Syn. Ex. 2 | 36 | Syn. Ex. 1 | 4 | 76 Mpa |
| Ex. 2 | Syn. Ex. 3 | 32 | Syn. Ex. 1 | 8 | 80 Mpa |
| Ex. 3 | Syn. Ex. 4 | 32 | Syn. Ex. 1 | 8 | 74 Mpa |
| Ex. 4 | Syn. Ex. 5 | 32 | Syn. Ex. 1 | 8 | 70 Mpa |

Examples 5 and 6

Copper clad laminates were prepared in the same manner as in Example 1 except that a polyimide resin layer composed of three layers was formed using the polyimide precursor solutions as shown in the following Tables 4 and 5, and then the coefficient of thermal expansion of the polyimide resin layer (20a) composed of three layers (21a, 22a, 23a) was measured (see Table 6). Further, the high-temperature adhesiveness between the copper clad (10) and the polyimide resin layer (20a), and the modulus of elasticity of the polyimide resin layer (20a) was measured (see Tables 4 and 5).

TABLE 4

| | First Layer | | Second Layer | | Third Layer | | High-temperature |
|---|---|---|---|---|---|---|---|
| | Solution | Thickness (μm) | Solution | Thickness (μm) | Solution | Thickness (μm) | Adhesiveness (g/cm) |
| Ex. 5 | Syn. Ex. 3 | 5 | Syn. Ex. 2 | 32 | Syn. Ex. 6 | 3 | 1150 |
| Ex. 6 | Syn. Ex. 5 | 3 | Syn. Ex. 2 | 34 | Syn. Ex. 6 | 3 | 1080 |

TABLE 5

| | First Layer | | Second Layer | | Third Layer | | Modulus of Elasticity (400° C.) |
|---|---|---|---|---|---|---|---|
| | Solution | Thickness (μm) | Solution | Thickness (μm) | Solution | Thickness (μm) | |
| Ex. 5 | Syn. Ex. 3 | 5 | Syn. Ex. 2 | 32 | Syn. Ex. 6 | 3 | 79 Mpa |
| Ex. 6 | Syn. Ex. 5 | 3 | Syn. Ex. 2 | 34 | Syn. Ex. 6 | 3 | 72 Mpa |

TABLE 6

| | Coefficient of Thermal Expansion × $10^{-6}$ (1/K) |
|---|---|
| Example 1 | 16 |
| Example 2 | 20 |
| Example 3 | 19 |
| Example 4 | 20 |
| Example 5 | 17 |
| Example 6 | 17 |

Comparative Example 1

The copper clad was coated with the polyimide precursor solution prepared in Synthetic Example 2 to a thickness of 30 □, and then dried at 140° C. Thereafter, the copper clad was coated with the polyimide precursor solution prepared in Synthetic Example 1 in the same manner for contacting the clad with the solution to a thickness of 10 □, dried and then cured by raising the temperature up to 350° C. The cured polyimide resin layer had a high-temperature adhesiveness of 1000 g/cm and a modulus of elasticity at 400° C. of 65 Mpa.

Comparative Example 2

The copper clad was coated with the polyimide precursor solution prepared in Synthetic Example 6 to a thickness of 5 □. Then, the copper clad was coated with the polyimide precursor solution prepared in Synthetic Example 2 in the same manner to a thickness of 33□, and then dried. Thereafter, the copper clad was coated with the polyimide precursor solution prepared in Synthetic Example 1 in the same manner to a thickness of 2 □, dried and then cured by raising the temperature up to 350° C., thereby preparing a three-layered copper clad laminate. The cured polyimide resin layer had a high-temperature adhesiveness of 500 g/cm and a modulus of elasticity at 400° C. of 5 Mpa.

The high-temperature adhesiveness and the modulus of elasticity of Comparative Examples 1 and 2 are summarized in Tables 7 and 8.

TABLE 7

| | First Layer | | Second Layer | | Third Layer | | High-temperature |
|---|---|---|---|---|---|---|---|
| | Solution | Thickness (μm) | Solution | Thickness (μm) | Solution | Thickness (μm) | Adhesiveness (g/cm) |
| Comp. Ex. 1 | Syn. Ex. 2 | 30 | Syn. Ex. 1 | 10 | | | 1000 |
| Comp. Ex. 2 | Syn. Ex. 6 | 5 | Syn. Ex. 2 | 33 | Syn. Ex. 1 | 2 | 500 |

TABLE 8

| | First Layer | | Second Layer | | Third Layer | | Modulus |
|---|---|---|---|---|---|---|---|
| | Solution | Thickness (μm) | Solution | Thickness (μm) | Solution | Thickness (μm) | of Elasticity (400° C.) |
| Comp. Ex. 1 | Syn. Ex. 2 | 30 | Syn. Ex. 1 | 10 | | | 65 Mpa |
| Comp. Ex. 2 | Syn. Ex. 6 | 5 | Syn. Ex. 2 | 33 | Syn. Ex. 1 | 2 | 5 Mpa |

Meanwhile, the metal layer of the copper clad laminate according to each of Examples 1 to 6 and Comparative Examples 1 and 2 was etched so as to form the copper foil circuit pattern, and then the IC chip having the Au bump was mounted on the copper clad laminate according to each of Examples 1 to 6 and Comparative Examples 1 and 2 using the stage 30 and the tool bonder 31 on the conditions of the temperature of the stage 30 ranging from 30 to 200° C., the temperature of the tool bonder 31 ranging from 350 to 450° C., and a compressive force ranging from 6 to 14 kgf. At this time, it was confirmed whether or not the copper foil circuit pattern formed on the polyimide resin layer is collapsed.

TABLE 9

| | Chip Mounting Test |
|---|---|
| Example 1 | Good |
| Example 2 | Good |
| Example 3 | Good |
| Example 4 | Good |
| Example 5 | Good |
| Example 6 | Good |
| Comparative Example 1 | Defective |
| Comparative Example 2 | Defective |

As can be seen from Table 9 and FIGS. 4 and 5, when the copper foil circuit pattern of the copper clad laminate according to each of Examples 1 to 6 and the Au bump 41 of the IC chip 40 are bonded to each other, the copper foil circuit pattern 10a formed on the polyimide resin layer 20 (or 20a) according to each of Examples 1 to 6 of the present invention is not collapsed. However, in the copper clad laminate according to each of Comparative Examples 1 and 2, the same result as FIG. 9, which shows the related art, was obtained. That is, in the copper clad laminate according to each of Comparative Examples 1 and 2, the copper foil circuit pattern was compressed toward the polyimide resin layer and then collapsed.

In the related art and Comparative Examples 1 and 2, since the temperature of the tool bonder 131 is high upon bonding of the IC chip 140, the polyimide resin layer is softened, and the copper foil circuit pattern 110a is collapsed due to a compressive force of the tool bonder 131. In contrast, according to the present invention, since the modulus of elasticity is 70 Mpa or more at high temperature of 400° C. or more, the copper foil circuit pattern 10a can be prevented from being collapsed.

Further, unlike the related art and Comparative Examples 1 and 2 in which adhesiveness is degraded at high temperature, in the present invention, when the polyimide resin layer having a coefficient of thermal expansion of 20 ppm/K or less is laminated directly on the copper foil layer, it can be confirmed that high-temperature adhesiveness between the copper foil layer and the polyimide resin layer is improved.

In addition, since the two-layered polyimide resin layer of the metallic laminate is formed, the structure can be simplified, compared with a three-layered polyimide resin layer. Therefore, ease of production can be realized, productivity can be improved, and production costs can be reduced.

The invention claimed is:

1. A method for preparing a metallic laminate, the method comprising a step of: coating a polyimide precursor solution on a metal layer and drying and curing the polyimide precursor solution so as to form a polyimide resin layer having a modulus of elasticity of 70 Mpa or more at 400° C., wherein the step of forming the polyimide resin layer includes the steps of: coating a first polyimide precursor solution on the metal layer and drying and curing the first polyimide precursor solution so as to form a first polyimide resin layer having a coefficient of thermal expansion of 20 ppm/K or less; and coating a second polyimide precursor solution on the first polyimide resin layer and drying and curing the second polyimide precursor solution so as to form a second polyimide resin layer having a coefficient of thermal expansion of more than 20 ppm/K, and the polyimide resin layer including the first and second polyimide resin layers has a coefficient of thermal expansion of 20 ppm/K or less.

2. The method according to claim 1, wherein the first polyimide resin layer has a thickness of 80% or more of the total thickness of the polyimide resin layer including the first and second polyimide resin layers.

3. The method according to claim 1, wherein the thickness of the first polyimide resin layer is in a range of 30 μm to 40 μm.

4. A method for preparing a metallic laminate, the method comprising a step of: coating a polyimide precursor solution on a metal layer and drying and curing the polyimide precursor solution so as to form a polyimide resin layer having a modulus of elasticity of 70 Mpa or more at 400° C., wherein the step of forming the polyimide resin layer includes the steps of: coating a first polyimide precursor solution on the metal layer and drying the first polyimide precursor solution so as to form a first drying resin layer; coating a second polyimide precursor solution on the first drying resin layer and drying the second polyimide precursor solution so as to form a second drying resin layer; and curing the first and second drying resin layers so as to form a first polyimide resin layer having a coefficient of thermal expansion of 20 ppm/K or less and a second polyimide resin layer having a coefficient of thermal expansion of more than 20 ppm/K, and the polyimide resin layer including the first and second polyimide resin layers has a coefficient of thermal expansion of 20 ppm/K or less.

5. A method for preparing a metallic laminate, the method comprising a step of: coating a polyimide precursor solution on a metal layer and drying and curing the polyimide precursor solution so as to form a polyimide resin layer having a modulus of elasticity of 70 Mpa or more at 400° C., wherein the step of forming the polyimide resin layer includes the steps of: coating a first polyimide precursor solution on the metal layer and drying and curing the first polyimide precursor solution so as to form a first polyimide resin layer having a coefficient of thermal expansion of 20 ppm/K or less; coating a second polyimide precursor solution on the first polyimide resin layer and drying and curing the second polyimide precursor solution so as to form a second polyimide resin layer having a coefficient of thermal expansion of 20 ppm/K or less; coating a third polyimide precursor solution on the second polyimide resin layer and drying and curing the third polyimide precursor solution so as to form a third polyimide resin layer having a coefficient of thermal expansion of 20 ppm/K or more, and the polyimide resin layer include the first to third polyimide resin layers.

6. The method according to claim 5, wherein the polyimide resin layer including the first to third polyimide resin layers has a coefficient of thermal expansion of 20 ppm/K or less.

7. A method for preparing a metallic laminate, the method comprising a step of: coating a polyimide precursor solution on a metal layer and drying and curing the polyimide precursor solution so as to form a polyimide resin layer having a modulus of elasticity of 70 Mpa or more at 400° C., wherein the step of forming the polyimide resin layer includes the steps of: coating a first polyimide precursor solution on the metal layer and drying the first polyimide precursor solution so as to form a first drying resin layer; coating a second polyimide precursor solution on the first drying resin layer and drying the second polyimide precursor solution so as to form a second drying resin layer; coating a third polyimide precursor solution on the second drying resin layer and drying the third polyimide precursor solution so as to form a third drying resin layer; and curing the first to third drying resin layers so as to form a first polyimide resin layer having a coefficient of thermal expansion of 20 ppm/K or less, a second polyimide resin layer having a coefficient of thermal expansion of 20 ppm/K or less, and a third polyimide resin layer having a coefficient of thermal expansion of 20 ppm/K or more, and the polyimide resin layer include the first to third polyimide resin layers.

8. The method according to claim 7, wherein the polyimide resin layer including the first to third polyimide resin layers has a coefficient of thermal expansion of 20 ppm/K or less.

* * * * *